United States Patent
Okabe et al.

(10) Patent No.: US 10,658,421 B2
(45) Date of Patent: May 19, 2020

(54) METHOD OF MANUFACTURING PHOTOELECTRIC CONVERSION APPARATUS USING ION IMPLANTATION

(71) Applicant: CANON KABUSHIKI KAISHA, Tokyo (JP)

(72) Inventors: Takehito Okabe, Yokohama (JP); Mitsuhiro Yomori, Tama (JP); Nobuaki Kakinuma, Tokyo (JP); Toshihiro Shoyama, Kawasaki (JP); Masashi Kusukawa, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/115,317

(22) Filed: Aug. 28, 2018

(65) Prior Publication Data
US 2019/0067364 A1 Feb. 28, 2019

(30) Foreign Application Priority Data

Aug. 31, 2017 (JP) .................................. 2017-167257

(51) Int. Cl.
*H01L 27/146* (2006.01)
(52) U.S. Cl.
CPC .. *H01L 27/14689* (2013.01); *H01L 27/14614* (2013.01); *H01L 27/14643* (2013.01)
(58) Field of Classification Search
CPC ......... H01L 27/14689; H01L 27/14643; H01L 27/14614
See application file for complete search history.

(56) References Cited

U.S. PATENT DOCUMENTS

| | | | |
|---|---|---|---|
| 2004/0232494 A1 | 11/2004 | Nagano | |
| 2008/0001192 A1* | 1/2008 | Inoue | H01L 27/14603 257/291 |
| 2008/0029793 A1 | 2/2008 | Watanabe | |
| 2010/0173444 A1* | 7/2010 | Mishima | H01L 27/14603 438/60 |
| 2011/0108836 A1* | 5/2011 | Koyama | H01L 27/1225 257/43 |
| 2013/0321680 A1* | 12/2013 | Kumano | H01L 27/14636 348/273 |
| 2014/0346578 A1 | 11/2014 | Hirota | |
| 2015/0155173 A1* | 6/2015 | Hirota | H01L 21/02164 438/682 |

(Continued)

FOREIGN PATENT DOCUMENTS

| | | |
|---|---|---|
| JP | 2006-210583 A | 8/2006 |
| JP | 2008-041726 A | 2/2008 |

(Continued)

*Primary Examiner* — Julia Slutsker
(74) *Attorney, Agent, or Firm* — Canon USA, Inc. IP Division

(57) ABSTRACT

A method of manufacturing a photoelectric conversion apparatus includes heating a semiconductor substrate while a pixel circuit area is covered with an insulator film, performing ion implantation into the pixel circuit area through the insulator film, performing ion implantation into a peripheral circuit area after the heating, and forming a side wall on a side surface of a gate electrode of a transistor after the performing ion implantation into the peripheral circuit area.

24 Claims, 4 Drawing Sheets

(56) References Cited

U.S. PATENT DOCUMENTS

| | | | |
|---|---|---|---|
| 2016/0043131 A1* | 2/2016 | Kamino | H01L 27/1462 257/225 |
| 2016/0126284 A1* | 5/2016 | Kato | H01L 27/14685 257/292 |
| 2016/0163758 A1* | 6/2016 | Iwasaki | H01L 27/14643 257/225 |
| 2016/0343761 A1* | 11/2016 | Ishino | H01L 27/1462 |
| 2017/0213862 A1* | 7/2017 | Kamino | H01L 27/14605 |

FOREIGN PATENT DOCUMENTS

| | | |
|---|---|---|
| JP | 2008-270668 A | 11/2008 |
| JP | 2010-021253 A | 1/2010 |
| JP | 2010-161236 A | 7/2010 |
| JP | 2012-146989 A | 8/2012 |
| JP | 2012-160750 A | 8/2012 |
| JP | 2014-229801 A | 12/2014 |
| JP | 2017-118121 A | 6/2017 |
| WO | 03/096421 A1 | 11/2003 |

* cited by examiner

METHOD OF MANUFACTURING PHOTOELECTRIC CONVERSION APPARATUS USING ION IMPLANTATION

BACKGROUND OF THE INVENTION

Field of the Invention

One disclosed aspect of the embodiments relates to a method of manufacturing a photoelectric conversion apparatus.

Description of the Related Art

To improve performance of a photoelectric conversion apparatus such as an imaging apparatus, achievement of both characteristics of a pixel circuit area and a peripheral circuit area is important. In the pixel circuit area, reduction of damage occurred in a semiconductor substrate is important. This is because the damage occurred in the semiconductor substrate causes white flaws (white spots) or the like and deteriorates the characteristics of a pixel circuit. Further, in the peripheral circuit area, microfabrication of a transistor is important for high-speed operation and integration of peripheral circuits.

Japanese Patent Application Laid-Open No. 2010-161236 discusses that ions are implanted while a gate electrode (21) of a transfer transistor is covered with an insulation film (30i), to form a protection region (14).

Japanese Patent Application Laid-Open No. 2010-21253 discusses that a thermal oxide film TS is formed through thermal oxidation of a surface of a side wall of a polysilicon electrode PS, and ions are implanted into a semiconductor substrate SB so as to transmit through the thermal oxide film TS.

The techniques discussed in Japanese Patent Application Laid-Open Nos. 2010-161236 and 2010-21253 are insufficient to improve characteristics of both of the pixel circuit area and the peripheral circuit area.

SUMMARY OF THE INVENTION

According to an aspect of the embodiments, a method of manufacturing a photoelectric conversion apparatus includes preparing a semiconductor substrate that includes a pixel circuit area and a peripheral circuit area, forming an insulator film that covers the pixel circuit area and the peripheral circuit area after formation of a gate electrode of a first transistor over the pixel circuit area, heating the semiconductor substrate while the pixel circuit area is covered with the insulator film, performing ion implantation into the pixel circuit area through the insulator film, performing ion implantation into the peripheral circuit area after formation of a gate electrode of a second transistor over the peripheral circuit area and after the heating, and forming a side wall on a side surface of the gate electrode of the second transistor after the ion implantation into the peripheral circuit area. In the ion implantation into the peripheral circuit area, at least a part of a source/drain region of the second transistor is formed.

Further features of the disclosure will become apparent from the following description of exemplary embodiments with reference to the attached drawings.

DESCRIPTION OF THE EMBODIMENTS

Figure 1A:
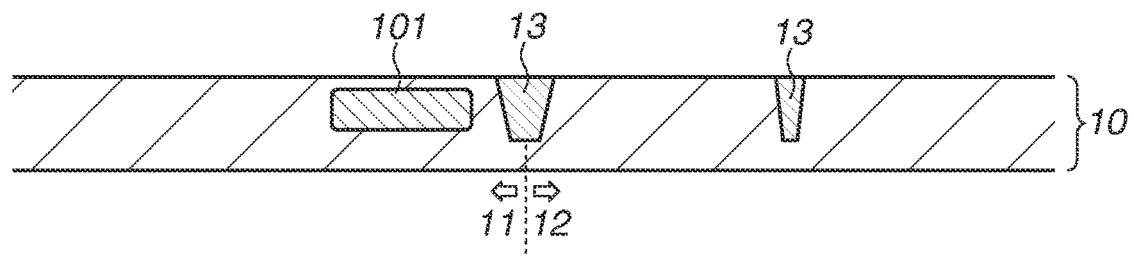
FIGS. 1A to 1D are schematic cross-sectional views illustrating a method of manufacturing a photoelectric conversion apparatus.

Some exemplary embodiments of the embodiments will be described below with reference to drawings. In the following description and the drawings, components common to a plurality of drawings are denoted by common reference numerals. In addition, the common components are described with mutual reference to the plurality of drawings in some cases. Further, description of the components denoted by the common reference numerals is omitted in some cases.

A method of manufacturing a photoelectric conversion apparatus is described with reference to FIGS. 1A to 4D. FIGS. 1A to 4D are schematic cross-sectional views illustrating a main part of the photoelectric conversion apparatus.

In a process a in FIG. 1A, a semiconductor substrate 10 such as a silicon wafer is prepared. The semiconductor substrate 10 includes a pixel circuit area 11 on which a pixel circuit is to be formed through manufacturing processes, and a peripheral circuit area 12 on which peripheral circuits are to be formed through the manufacturing processes. The pixel circuit includes a transfer transistor, an amplification transistor, a reset transistor, etc. The peripheral circuits may include a correlated double sampling (CDS) circuit, an amplification circuit, and an analog-to-digital conversion (ADC) circuit. Further, the peripheral circuits may include a control circuit such as a timing generator, and drive circuits such as a horizontal scanning circuit and a vertical scanning circuit.

A device portion of the semiconductor substrate 10 is defined by a device isolation portion 13. The device isolation portion 13 has, for example, a local oxidation of silicon (LOCOS) structure or a shallow trench isolation (STI) structure. Further, in the process a, a well region (not illustrated) and a photoelectric conversion region 101 that has a photodiode structure are provided in the pixel circuit area 11 of the semiconductor substrate 10. A well region (not illustrated) is provided also in the peripheral circuit area 12.

Figure 1B:
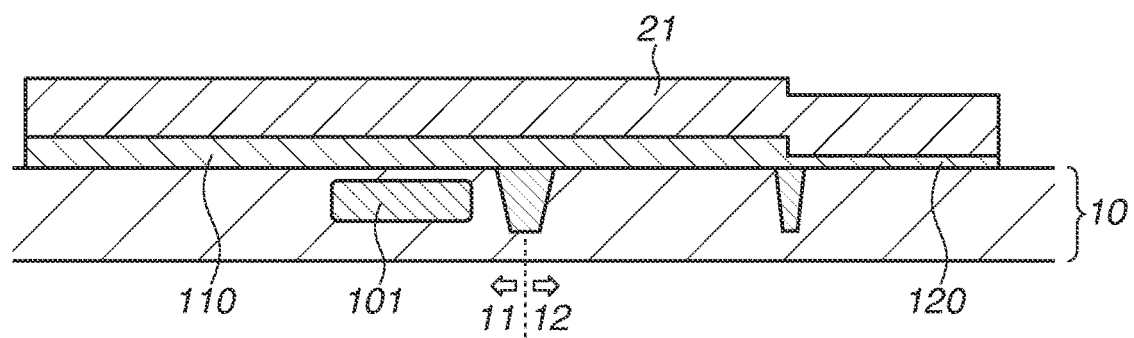

In a process b in FIG. 1B, an insulation film 110 and an insulation film 120 serving as gate insulation films are formed on the semiconductor substrate 10. The insulation film 110 includes a thickness larger than a thickness of the insulation film 120. The insulation film 110 is formed on the pixel circuit area 11 and on a part of the peripheral circuit area 12, and the insulation film 12 is formed on the other part of the peripheral circuit area 12. The insulation films 110 and 120 are each a silicon oxide film. The insulation films 110 and 120 each may be a silicon oxide film containing nitrogen. The insulation films 110 and 120 are formable by a thermal oxidation method. The insulation films 110 and 120 each may be a high-k insulation film.

A conductive film 21 is further formed on the insulation films 110 and 120. The conductive film 21 is formable by a chemical vapor deposition (CVD) method. The conductive film 21 according to the present exemplary embodiment is a single layer film of a polysilicon layer; however, the conductive film 21 may be a multilayer film including a polysilicon layer and a metal layer, a multilayer film including a polysilicon layer and a metal compound layer, or a multilayer film including a metal layer and a metal compound layer.

Figure 1C:
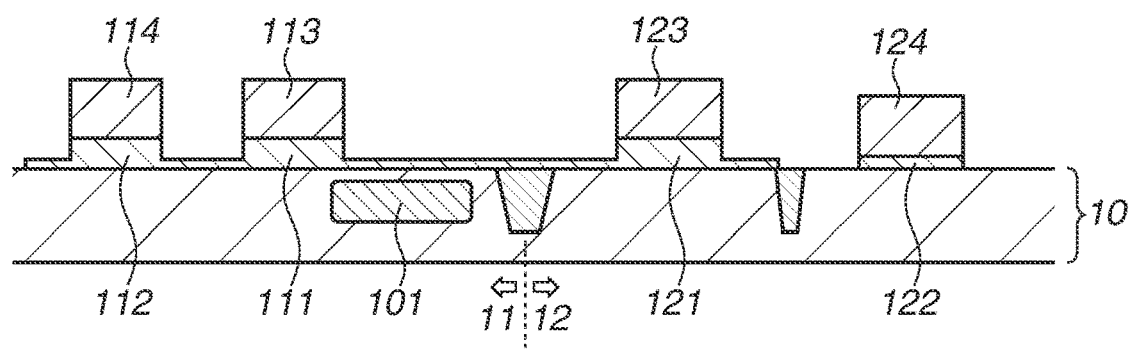

In a process c in FIG. 1C, patterning is performed on the conductive film 21 to form gate electrodes 113, 114, 123, and 124 over the semiconductor substrate 10. The gate electrodes 113 and 114 are formed over the pixel circuit area 11, and the gate electrodes 123 and 124 are formed over the peripheral circuit area 12. The patterning of the conductive film 21 may be performed by dry etching using a photoresist as a mask. An inorganic insulation film such as a silicon oxide film or a silicon nitride film may be formed on the conductive film 21, patterning may be performed on the inorganic insulation film with use of a photoresist, and the patterning of the conductive film 21 may be then performed with use of the patterned inorganic insulation film as a mask (hard mask).

After the conductive film 21 is etched, the photoresist and a residue containing an organic matter generated by the etching are removed. To remove the residue, cleaning may be performed with use of an alkaline solution or an acid solution, for example, hydrofluoric acid, ammonia hydrogen peroxide, sulfuric acid/hydrogen peroxide mixture or the like, or dry etching such as ashing may be performed.

Respective parts of the insulation films 110 and 120 overlapped with the gate electrodes 113, 114, 123, and 124 become gate insulation films 111, 112, 121, and 122 through the patterning of the conductive film 21. The gate insulation films 111, 112, and 121 are formed from the insulation film 110, and each have a thickness larger than a thickness of the gate insulation film 122 formed from the insulation film 120. For example, the thickness of each of the gate insulation films 111, 112, and 121 is 5 nm to 10 nm, and the thickness of the gate insulation film 122 is 1 nm to 5 nm. The thickness of each of the gate insulation films 111, 112, and 121 may be more than 10 nm. Parts (non-overlapped parts) of the insulation films 110 and 120 that are not overlapped with the gate electrodes 113, 114, 123, and 124 are overetched through the patterning of the conductive film 21. It is not, however, preferable, in terms of reduction of damage to the semiconductor substrate 10, that the non-overlapped parts be completely removed and the semiconductor substrate 10 be accordingly exposed. Accordingly, the non-overlapped parts are preferably remained on the semiconductor substrate 10 as extending parts (remaining films) extended from the gate insulation films 111, 112, and 121. The extending parts each typically have a thickness that is smaller than the thickness of each of the gate insulation films 111, 112, and 121, due to the above-described overetching. The thickness of each of the extending parts extended from the gate insulation films 111, 112, and 121 may be 1 nm to 5 nm. An extending part extended from the gate insulation film 122 may not be provided and the semiconductor substrate 10 may be exposed around the gate electrode 124 because the insulation film 120 is thin.

The gate electrode 113 and the gate insulation film 111 configure a gate of the transfer transistor, and the gate electrode 114 and the gate insulation film 112 configure a gate of the pixel transistor. The transfer transistor transfers signal charges of the photoelectric conversion region 101 to an electric charge detection region (described below). Therefore, the photoelectric conversion region 101 serves as a source region of the transfer transistor, and the electric charge detection region serves as a drain region of the transfer transistor. The pixel transistor is a reset transistor in the present exemplary embodiment; however, an amplification transistor or a selection transistor is similarly adoptable. The gate electrode 123 and the gate insulation film 121 configure a gate of a p-type peripheral transistor that is driven at a high voltage (e.g., 3.3 V). The gate electrode 124 and the gate insulation film 122 configure a gate of an n-type peripheral transistor that is driven at a low voltage (e.g., 1.2 V). These transistors each includes a metal-oxide-semiconductor field-effect transistor (MOSFET), but may include a bipolar transistor or a junction transistor. The peripheral transistor may configure a complementary MOS (CMOS) circuit. Using the respective transistors including the thick gate insulation films 111 and 112 in the pixel circuit makes it possible to improve characteristics of the pixel circuit in terms of electric charge transfer, driving force, and a dynamic range. On the other hand, using the transistor including the thin gate insulation film 122 in the peripheral circuit makes it possible to achieve high-speed operation and microfabrication of the peripheral circuit.

The source/drain region of the transistor is a general term of the source region and the drain region. The source/drain region may function as a source region or a drain region depending on circuit operation even if the region is the same. Further, in a case where one source/drain region is shared by a plurality of transistors, the region may serve as a source region of one of the transistors and also serve as a drain region of the other transistor.

Figure 1D:
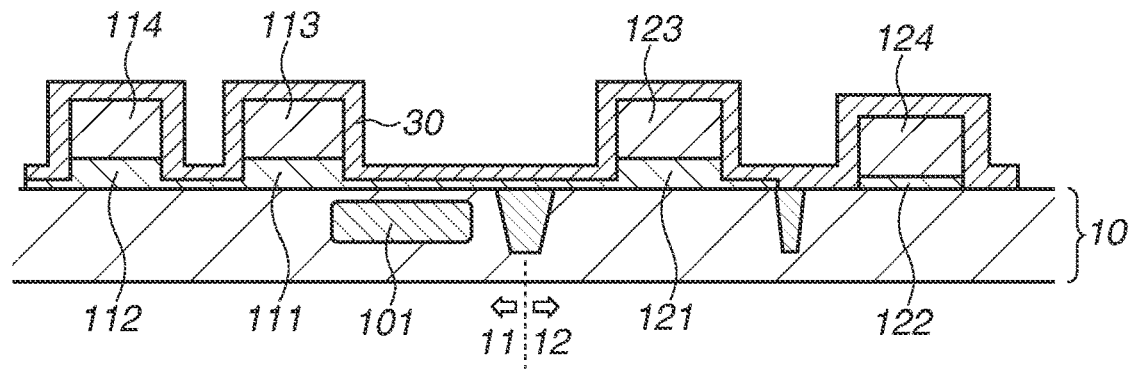

In a process d in FIG. 1D, an insulator film 30 that covers the pixel circuit area 11 and the peripheral circuit area 12 of the semiconductor substrate 10 is formed. The insulator film 30 also covers the gate electrodes 113, 114, 123, and 124. The extending parts extended from the gate insulation films 111, 112, 121, and 122 may be located between the insulator film 30 and the semiconductor substrate 10. The insulator film 30 is formable by the thermal oxidation method of the semiconductor substrate 10; however, the insulator film 30 is preferably formed by a deposition method such as a CVD method in terms of reduction of deformation, etc. of the semiconductor substrate 10. The insulator film 30 is preferably formed by a thermal CVD method rather than a plasma CVD method in terms of reduction of damage to the semiconductor substrate 10. Film formation temperature of the insulator film 30 by the thermal CVD method is, for example, 300° C. to 700° C. The insulator film 30 preferably contains an inorganic insulator material in terms of resistance to ion implantation to be described below and resistance to heat treatment. The insulator film 30 according to the present exemplary embodiment is a single layer film of a silicon oxide layer that is formed with use of tetraethyl orthosilicate (TEOS) by low pressure (LP)-CVD method; however, the insulator film 30 may be a single layer film of a silicon nitride layer or a multilayer film including a silicon oxide layer and a silicon nitride layer. A thickness of the insulator film 30 is set such that a sum of the thickness of each of the extending parts of the gate insulation films 111 and 112 and the thickness of the insulator film 30 becomes larger than the thickness of each of the gate insulation films 111 and 112. The thickness of the insulator film 30 is preferably larger than the thickness of each of the gate insulation films 111 and 112. The thickness of the insulator film 30 is, for example, 5 nm to 20 nm.

In the process d in FIG. 1D, treatment that heats the semiconductor substrate 10 is performed while at least the pixel circuit area 11 of the semiconductor substrate 10 is covered with the insulator film 30. In the present exemplary embodiment, the semiconductor substrate 10 is heated while the peripheral circuit area 12 is also covered with the insulator film 30. The heat treatment in the process d may be performed mainly in order to recover from damage occurred in the semiconductor substrate 10 in the formation of the gate electrodes 113, 114, 123, and 124. The insulator film 30 in the heat treatment has a function of appropriately mitigating distortion of the semiconductor substrate 10. Such a function is difficult to be achieved only by the thin extending parts of the gate insulation films 111 and 112. Therefore, a thick insulator (extending part and insulator film 30) that is larger in thickness than only the extending part is disposed on/over the semiconductor substrate 10, which achieves practicable effect of recovering from the damage. Since the silicon nitride layer typically has a stress larger than a stress of the silicon oxide layer, configuring the insulator film 30 by a single layer film of the silicon oxide layer is suitable to achieve the effect of recovering from the damage. In the process d, the semiconductor substrate 10 is typically heated to a temperature of 850° C. or higher. The temperature of the semiconductor substrate 10 by the heating is preferably 900° C. or higher, and more preferably 1000° C. or higher. The temperature of the semiconductor substrate 10 by the heating may be 1100° C. or lower. The temperature of the semiconductor substrate 10 is preferably made higher than the film formation temperature of the insulator film 30. A time of the heat treatment in the process d is preferably 10 seconds to 60 seconds. Rapid thermal anneal (RTA) may be used for the heating in the process d.

In a case where the insulator film 30 is formed by the thermal oxidation method, the formation of the insulator film 30 and the heating of the semiconductor substrate 10 may be performed in parallel.

Figure 2A:
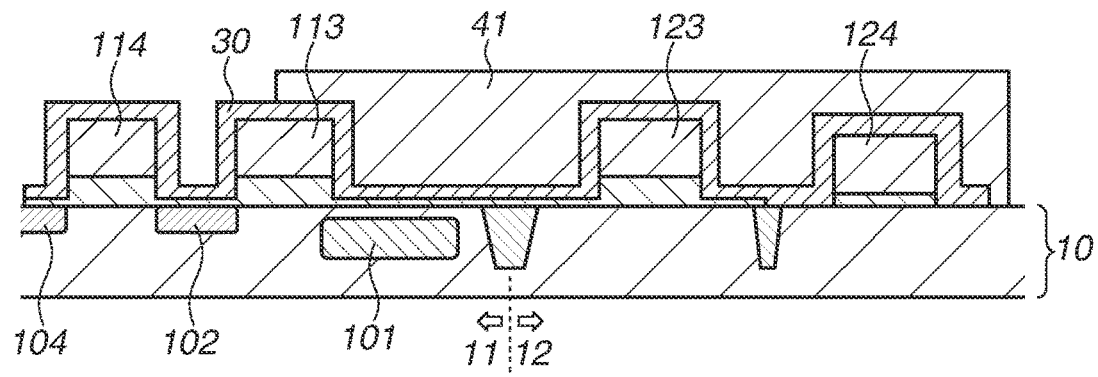
FIGS. 2A to 2D are schematic cross-sectional views illustrating the method of manufacturing the photoelectric conversion apparatus.

In a process e in FIG. 2A, ions are implanted into the pixel circuit area 11. Ions of an n-type impurity such as phosphorus (P) or arsenic (As) are implanted with use of, as a mask, a resist pattern 41 that has been appropriately patterned so as to cover a part of the pixel circuit area 11 and the peripheral circuit area 12, and the gate electrodes 113 and 114. As a result, an electric charge detection region 102 that is the drain region of the transfer transistor and a source/drain region 104 of the pixel transistor are formed. The electric charge detection region 102 is an impurity region serving as a floating diffusion (FD) region. The ion implantation in the process e is performed in such a manner that the impurity transmits through the insulator film 30.

Figure 2B:
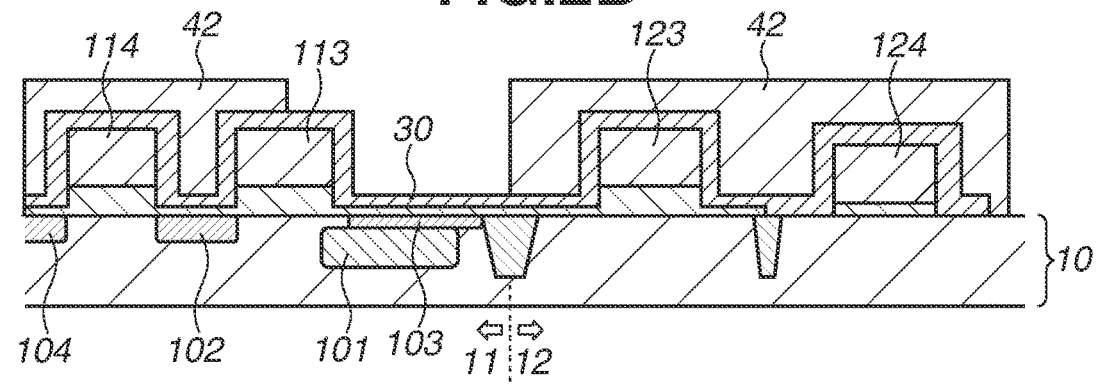

In a process f in FIG. 2B, ions are implanted into the pixel circuit area 11. Ions of a p-type impurity such as boron (B) are implanted with use of, as a mask, a resist pattern 42 that has been appropriately patterned so as to cover a part of the pixel circuit area 11 and the peripheral circuit area 12, and the gate electrodes 113 and 114. As a result, an impurity region 103 of a conductive type (p-type) opposite to a conductive type (n-type) of the photoelectric conversion region 101 is formed between the photoelectric conversion region 101 and the insulator film 30. The impurity region 103 functions as an isolation region that isolates the photoelectric conversion region 101 from a surface of the semiconductor substrate 10. The ion implantation in the process f is performed in such a manner that the impurity transmits through the insulator film 30.

Further, in the process f, ions are implanted into the pixel circuit area 11. The ions of a p-type impurity such as boron (B) are implanted with use of, as a mask, a resist pattern that has been appropriately patterned so as to cover a part of the pixel circuit area 11 and the peripheral circuit area 12. As a result, a p-type dense impurity region for application of a reference potential is formed in a p-type well region of the semiconductor substrate 10. The ion implantation in the process f is performed in such a manner that the impurity transmits through the insulator film 30.

Furthermore, in the process f, ions can be implanted into the peripheral circuit area 12. Ions of an n-type or p-type impurity are implanted with use of, as a mask, a resist pattern that has been appropriately patterned so as to cover the pixel circuit area 11 and a part of the peripheral circuit area 12. As a result, it is possible to form, in the peripheral circuit area 12 of the semiconductor substrate 10, an impurity region for adjustment of a threshold of the transistor and a halo region with an impurity concentration higher than that of the well region, for suppression of short channel effect. The ion implantation at this time is performed in such a manner that the impurity transmits through the insulator film 30. When a depth of the impurity region formed by transmission through the insulator film 30 is 10 nm or more, it is possible to perform ion implantation with high accuracy even if the impurity transmits through the insulator film 30 with the thickness of about 5 nm to about 20 nm.

In the processes e, f, etc., when the ion implantation is performed in such a manner that the impurity transmits through the insulator film 30, the insulator film 30 functions as a buffer film, which suppresses damage to the surface of the semiconductor substrate 10 during the ion implantation. This makes it possible to reduce white flaws.

Figure 2C:
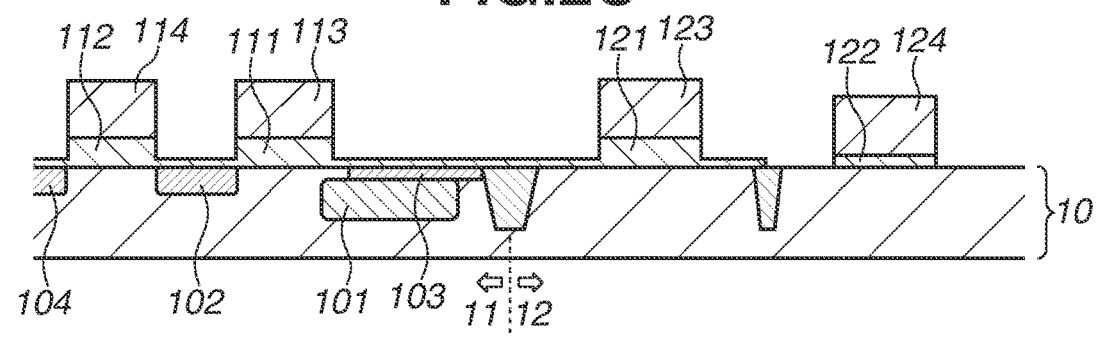

In a process g in FIG. 2C, treatment that heats the semiconductor substrate 10 is performed while at least the pixel circuit area 11 of the semiconductor substrate 10 is covered with the insulator film 30. In the present exemplary embodiment, the semiconductor substrate 10 is heated while the peripheral circuit area 12 is also covered with the insulator film 30. In the process g, the semiconductor substrate 10 is typically heated to 850° C. or higher. The heating in the process g that is performed after the processes e and f of implanting the ions into the pixel circuit area 11 is performed not to cause the temperature of the semiconductor substrate 10 to exceed the temperature of the semiconductor substrate 10 in the process d that is performed before the processes e and f of implanting the ions into the pixel circuit area 11. This makes it possible to suppress excessive diffusion of the impurity region formed in the processes e and f of implanting the ions into the pixel circuit area 11. For example, the temperature of the semiconductor substrate 10 in the heat treatment in the process d is 1000° C. or higher, and the temperature of the semiconductor substrate 10 in the heat treatment in the process g is lower than 1000° C., for example, 900° C. Further, to perform appropriate diffusion of the impurity region formed in the processes e and f, the heat treatment in the process g is preferably performed for 10 seconds to 60 seconds. Rapid thermal anneal (RTA) may be used for the heating in the process g.

As described above, distortion and lattice defect of the semiconductor substrate 10 are recovered by performing the treatment to heat the semiconductor substrate 10 under the presence of the insulator film 30 in the processes d, g, etc. This makes it possible to reduce white flaws. One of the heat treatment in the process d and the heat treatment in the process g may be omitted. Further, the heat treatment in the process g may be performed also as the heat treatment in the process d. For example, the heat treatment in the process d may be omitted and the heat treatment may be performed at 1000° C. or higher in the process g, like the process d.

In the process g in FIG. 2C, the insulator film 30 at least on/over the peripheral circuit area 12 is removed. In the present exemplary embodiment, the insulator film 30 over the charge detection region 102, the impurity region 103, and the drain region 104 that are the impurity regions formed in the processes e and f of implanting the ions into the pixel circuit area 11, is also removed. The insulator film 30 over the pixel circuit area 11 is removed, which makes it possible to prevent contamination occurred in the insulator film 30 during ion implantation from becoming a cause of white flaws, etc. A method having less etching damage is used to remove the insulator film 30 in the process g in order to suppress damage to the semiconductor substrate 10. Wet etching using, for example, hydrofluoric acid or ammonia hydrogen peroxide is suitable; however, dry etching with low damage may also be used. Exposure of the semiconductor substrate 10 is not essential in removal of the insulator film 30, and a part of the insulator film 30 may be removed and the remaining thin insulator film 30 may cover the semiconductor substrate 10.

Figure 2D:
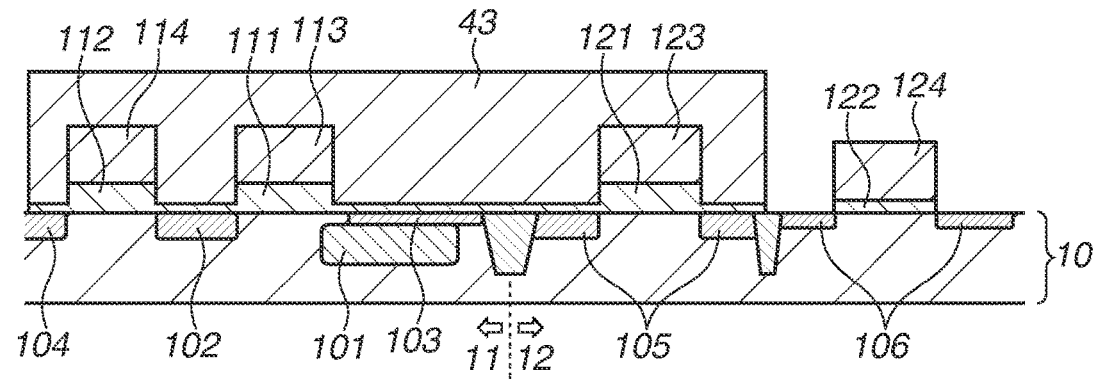

In a process h in FIG. 2D, ions are implanted into the peripheral circuit area 12. Ions of a p-type impurity such as boron (B) are implanted with use of, as a mask, a resist pattern (not illustrated) that has been appropriately patterned so as to cover the pixel circuit area 11 and a part of the peripheral circuit area 12. As a result, a low-concentration impurity part 105 that is a part (lightly doped drain (LDD)) of the source/drain region of the p-type transistor having the thick gate insulation film 121, is formed in the semiconductor substrate 10. Likewise, a low-concentration impurity part that is a part of the source/drain region of the n-type transistor having the thick gate insulation film 121 is formed.

Further, in the process h in FIG. 2D, ions are implanted into the peripheral circuit area 12. Ions of an n-type impurity such as phosphorus (P) or arsenic (As) are implanted with use of, as a mask, the resist pattern 43 that has been appropriately patterned so as to cover the pixel circuit area 11 and a part of the peripheral circuit area 12. As a result, a low-concentration impurity part 106 that is a part (LDD) of the source/drain region of the n-type transistor having the thin gate insulation film 122, is formed in the semiconductor substrate 10. Likewise, a low-concentration impurity part that is a part of the source/drain region of the p-type transistor having the thin gate insulation film 122, is formed.

Since the insulator film 30 is removed in the process g, it is possible to form, with high accuracy, the impurity region that has a depth of less than 10 nm from the surface of semiconductor substrate 10, in the ion implantation in the process h. In particular, the low-concentration impurity parts that are parts of the source/drain regions of the p-type and n-type transistors each having the thin gate insulation film 122 may be formed to have a depth of less than 5 nm from the surface. The implantation energy at this time may be less than 5 keV. In the process h, an impurity region that has a depth of 10 nm or more from the surface of the semiconductor substrate 10 may be formed.

In the ion implantation into the peripheral circuit area 12 in the process h, implantation energy and/or a dosage may be set lower than that in the ion implantation into the pixel circuit area 11 in the processes e and f. This makes it possible to achieve microfabrication and high-speed operation of the peripheral transistor. The impurity region formed under such a condition is easily deteriorated in characteristics due to diffusion in the heat treatment, and is largely influenced in characteristics of the transistor by the diffusion. In the present exemplary embodiment, however, the ion implantation in the process h is performed after the processes d and g including the heat treatment, which makes it possible to suppress abnormal diffusion of the impurity region formed in the process h.

Figure 3A:
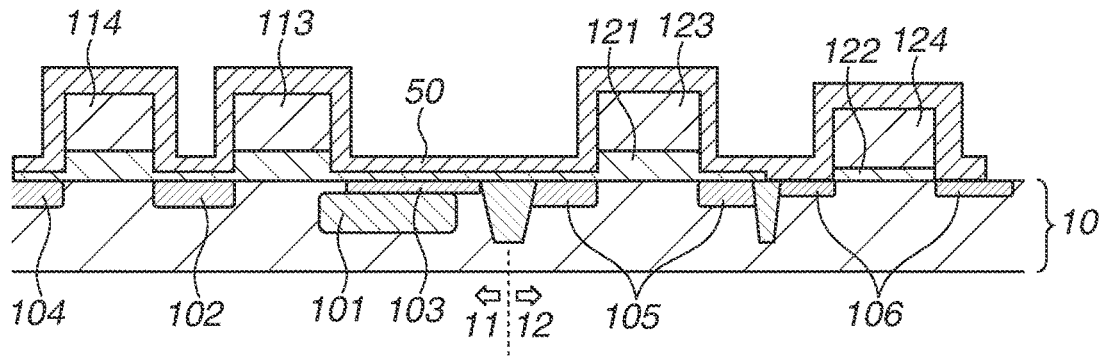
FIGS. 3A to 3D are schematic cross-sectional views illustrating the method of manufacturing the photoelectric conversion apparatus.

In a process i in FIG. 3A, a dielectric film 50 that covers side surfaces of the gate electrodes 123 and 124 of the transistors is formed. The dielectric film 50 also covers the gate electrodes 113 and 114. A thickness of the dielectric film 50 is about 50 nm to 200 nm, and is larger than the thickness of the insulator film 30. The dielectric film 50 according to the present exemplary embodiment is a multilayer film including a silicon oxide layer and a silicon nitride layer; however, the dielectric film 50 may be a single layer film of a silicon oxide layer or a single layer film of a silicon nitride layer. The dielectric film 50 is preferably formed at a temperature as low as possible in order to suppress diffusion of the impurity region formed in the process h. The film formation temperature of the dielectric film 50 is preferably set lower than the heat treatment temperature in the processes d and g. For example, even in a case where the dielectric film 50 is formed by a thermal CVD method, the film formation temperature is preferably set to about 500° C. to about 700° C.

Figure 3B:
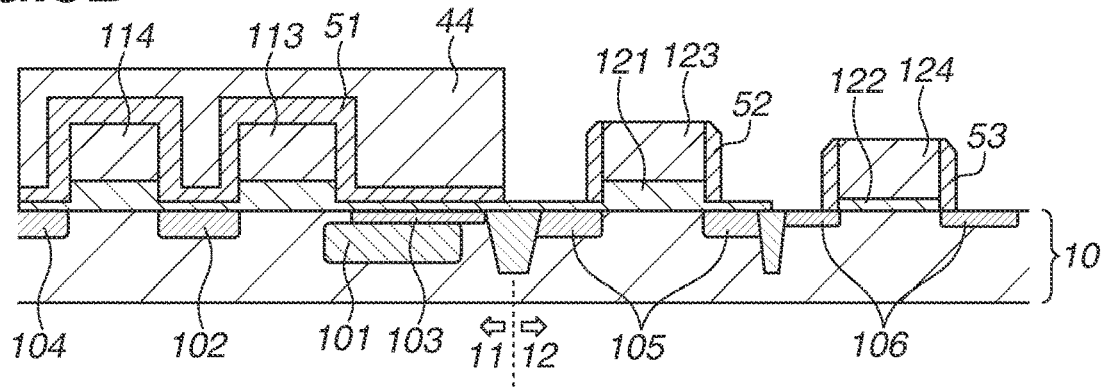

In a process j in FIG. 3B, side walls 52 and 53 that cover the side surfaces of the gate electrodes 123 and 124 are formed from the dielectric film 50. The side walls 52 and 53 are formed, in a self-aligning manner to the gate electrodes 123 and 124, by etching back the dielectric film 50 through anisotropic dry etching. In the present exemplary embodiment, a part of the dielectric film 50 located over the pixel circuit area 11 is remained as a dielectric film 51 by being protected by a resist pattern 44. When the dielectric film 51 includes a silicon nitride layer, the dielectric film 51 over the photoelectric conversion region 101 may function as an antireflection film. Alternatively, sidewalls that cover the side surfaces of the gate electrodes 113 and 114 may be formed over the pixel circuit area 11 from the dielectric film 50.

Figure 3C:
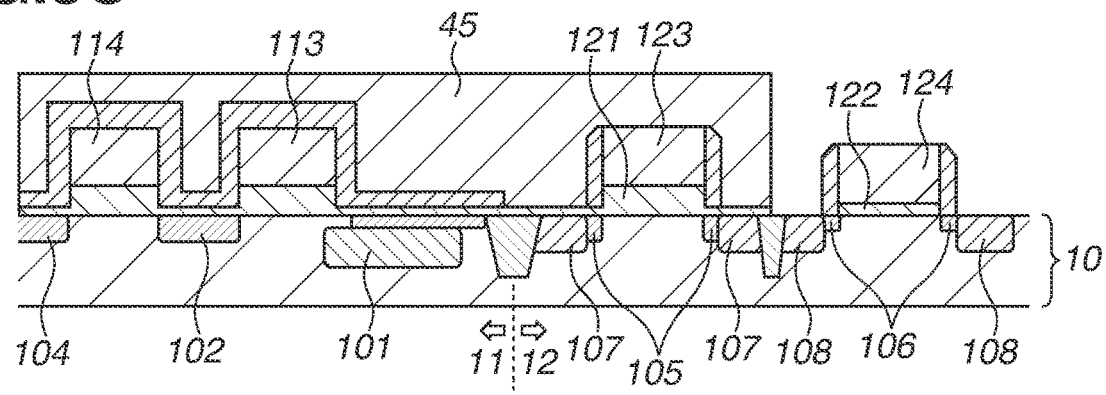

In a process k in FIG. 3C, ions are implanted into the peripheral circuit area 12. Ions of p-type impurity such as boron (B) are implanted with use of, as a mask, a resist pattern that has been appropriately patterned so as to cover the pixel circuit area 11 and a part of the peripheral circuit area 12, and the side wall 52. As a result, a high-concentration impurity part 107 that is a part of the source/drain region of the p-type transistor having the thick gate insulation film 121, is formed in the semiconductor substrate 10. The high-concentration impurity part 107 has an impurity concentration higher than the impurity concentration of the low-concentration impurity part 105. Likewise, a high-concentration impurity part that is a part of the source/drain region of the n-type transistor having the thick gate insulation film 121, is formed.

Further, in the process k in FIG. 3C, ions are implanted into the peripheral circuit area 12. Ions of an n-type impurity such as phosphorus (P) or arsenic (As) are implanted with use of, as a mask, a resist pattern 45 that has been appropriately patterned so as to cover the pixel circuit area 11 and a part of the peripheral circuit area 12, and the side wall 53. As a result, a high-concentration impurity part 108 that is a part of the source/drain region of the n-type transistor having the thin gate insulation film 122, is formed in the semiconductor substrate 10. The high-concentration impurity part 108 has an impurity concentration higher than the impurity concentration of the low-concentration impurity part 106. Likewise, a high-concentration impurity part that is a part of the source/drain region of the p-type transistor including the thin gate insulation film 122, is formed.

The process k is performed after the process j of forming the side walls 52 and 53. The high-concentration impurity parts 107 and 108 respectively are separated from the gate electrodes 123 and 124 of the transistors by the side walls 52 and 53 functioning as side spacers. Accordingly, in the ion implantation into the peripheral circuit area 12 in the process k, implantation energy and/or a dosage may be set higher than that in the ion implantation into the peripheral circuit area 12 in the process h.

Performing the heat treatment in the process d and the process g before the process h is advantageous because the process h including the ion implantation that is performed before the process j of forming the side walls 52 and 53, is a process of forming an impurity region, diffusion of which is largely influenced by heat as compared with the process k.

Figure 3D:
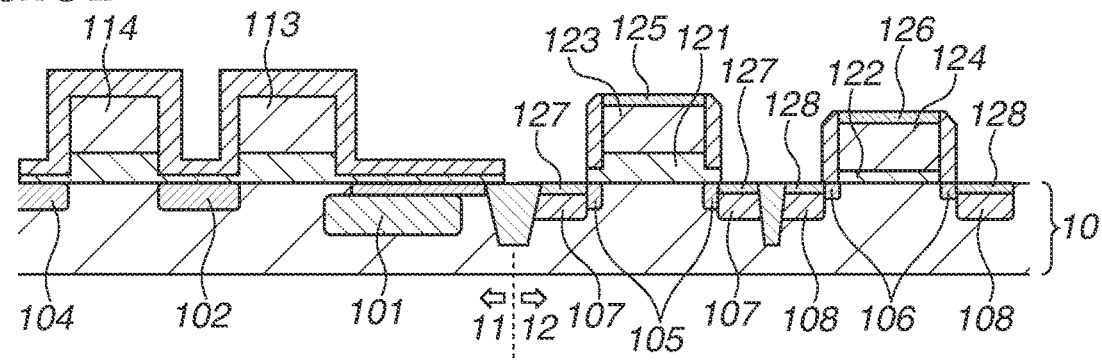

In a process 1 in FIG. 3D, a metal film (not illustrated) of cobalt, nickel, or the like. is formed on the semiconductor substrate 10. In the present exemplary embodiment, the metal film is provided in contact with the dielectric film 51. Silicide parts 127 and 128 are respectively formed on the high-concentration impurity parts 107 and 108 of the source/drain region by causing the metal film to react with the semiconductor substrate 10 (to be silicified). Likewise, silicide parts 125 and 126 are respectively formed on the gate electrodes 123 and 124 by causing the metal film to react with the gate electrodes 123 and 124 (to be silicified). As described above, the silicide parts 125, 126, 127, and 128 each contain cobalt silicide or nickel silicide formed through silicide process. The dielectric film 51 provided over the pixel circuit area 11 functions as a silicide protection against silicification.

Figure 4A:
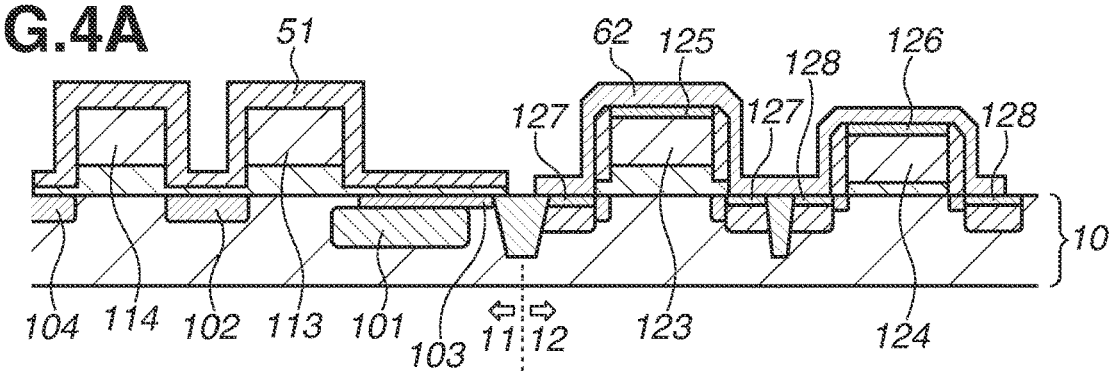
FIGS. 4A to 4D are schematic cross-sectional views illustrating the method of manufacturing the photoelectric conversion apparatus.

In a process m in FIG. 4A, a silicon nitride film is formed on/over the pixel circuit area 11 and the peripheral circuit area 12, and the silicon nitride film on/over the pixel circuit area 11 is removed to form a silicon nitride film 62 on/over the peripheral circuit area 12. The silicon nitride film 62 suppresses diffusion of the metal contained in the silicide parts 125, 126, 127, and 128. A silicon oxide film thinner than the silicon nitride film 62 may be disposed between the silicon nitride film 62 and each of the silicide parts 125, 126, 127, and 128.

Figure 4B:
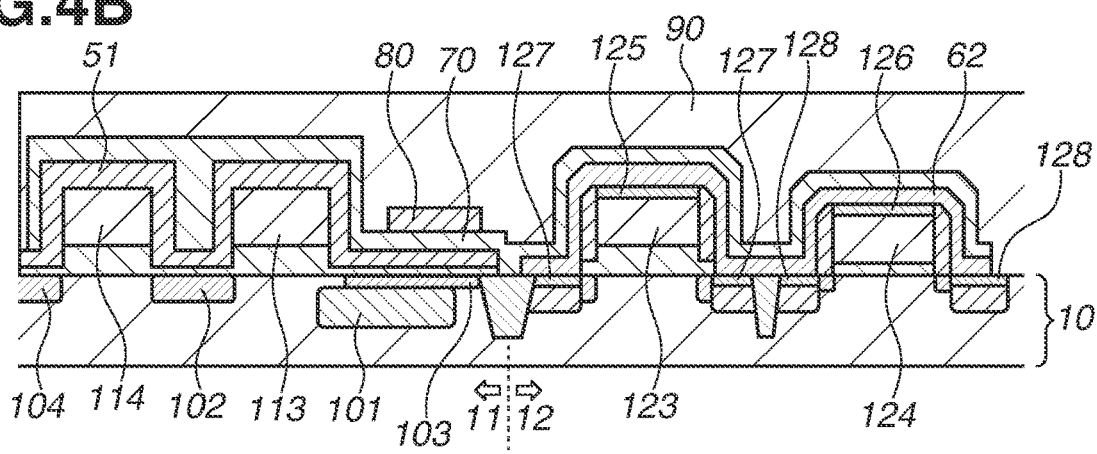

In a process n in FIG. 4B, a silicon oxide film 70 is formed on/over the pixel circuit area 11 and the peripheral circuit area 12. The silicon oxide film 70 is preferably formed by a high density plasma (HDP)-CVD method. The HDP-CVD method allows the silicon oxide film 70 to favorably cover irregularity caused by the gate electrodes 113, 114, 123, and 124 over the semiconductor substrate 10, thereby reducing voids of the silicon oxide film 70. Further, a silicon nitride film 80 is formed on the silicon oxide film 70 as well as over the photoelectric conversion region 101. Further, an interlayer insulation film 90 is formed on/over the semiconductor substrate 10. Planarization treatment is performed on the interlayer insulation film 90 by a chemical mechanical polishing (CMP) method, a reflow method, an etchback method, or the like. Thereafter, a contact hole (not illustrated) is formed in the interlayer insulation film 90, and a contact plug is formed inside the contact hole. The dielectric film 51 over the pixel circuit area 11 is used as an etching stopper in the formation of the contact hole. The contact hole over the pixel circuit area 11 exposes the semiconductor substrate 10 and the gate electrodes 113 and 114. The silicon nitride film 62 on/over the peripheral circuit area 12 is used as an etching stopper in the formation of the contact hole. The contact hole over the peripheral circuit area 12 exposes the silicide parts 125, 126, 127, and 128.

Figure 4C:
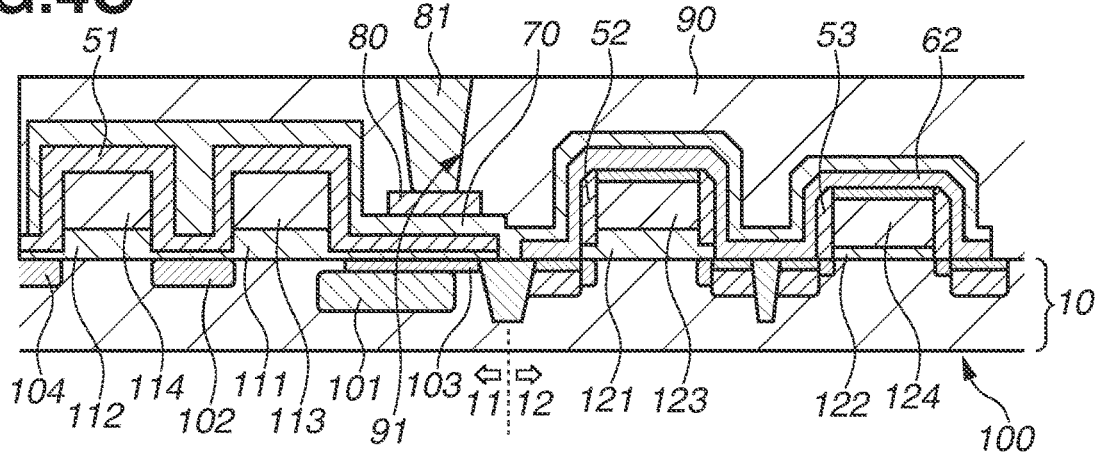

In a process o in FIG. 4C, a multilayer wiring structure (not illustrated) of an Al wiring and a Cu wiring is formed on the interlayer insulation film 90. An opening 91 is formed in an interlayer insulation film of the multilayer wiring structure and in the interlayer insulation film 90 over the photoelectric conversion region 101. The silicon nitride film 80 is used as an etching stopper in the formation of the opening 91. A dielectric region 81 is formed by filling the opening 91 with a dielectric material such as silicon oxide, silicon nitride, or a resin. A refractive index of the dielectric material is made higher than that of the interlayer insulation film 90, which can provide an optical waveguide structure in which the dielectric region 81 functions as a core and the interlayer insulation film 90 functions as a clad. The dielectric region 81 and the silicon nitride film 80 both preferably contain silicon nitride in terms of improvement of sensitivity because reflection of light by a boundary therebetween is suppressed. Instead of the silicon nitride film 80 formed in the process n, the silicon nitride film to form the silicon nitride film 62 may be partially left on/over the pixel circuit area 11 in the process n.

Thereafter, a color filter and a micro lens are formed. The wafer as the semiconductor substrate 10 is diced to obtain individual chips. Each of the chips is packaged to manufacture a photoelectric conversion apparatus 100. The photoelectric conversion apparatus 100 is mountable, as an imaging apparatus, on an electronic apparatus such as a camera or a smartphone, or a transportation machine such as a vehicle, an airplane, or a vessel.

As described above, performing the ion implantation and the heat treatment in the presence of the insulator film 30 makes it possible to reduce white flaws (white spots) occurred in the pixel circuit area 11. Further, the ion implantation and the heat treatment are performed at timings as described above, which makes it possible to improve the characteristics of the transistor in the peripheral circuit area 12.

A first modification in which the ion implantation is performed in the presence of the insulator film 30 in the processes e and f, and the heat treatment is not performed in the processes d and g is conceivable. In addition, a second modification in which the insulator film 30 is not present in the ion implantation in the processes e and f and the heat treatment is performed in the presence of the insulator film 30 in the process d is also conceivable. It is, however, known that the effect of reducing white flaws obtained by performing both of the ion implantation and the heat treatment in the presence of the insulator film 30 is larger than the total of the effects of reducing white flaws that are obtained in the first modification and the second modification. In other words, the ion implantation in the presence of the insulator film 30 and the heat treatment in the presence of the insulator film 30 have a synergistic effect. Performing the ion implantation in the presence of the insulator film 30 and the heat treatment in the presence of the insulator film 30 makes it possible to suppress white flaws to, for example, less than ⅟₁₀ of white flaws in a case where the ion implantation and the heat treatment are performed without providing the insulator film 30.

The example in which the photoelectric conversion region 101 is formed before the process d, further before the process c has been described. This allows for microfabrication of the pixel circuit. The photoelectric conversion region 101, however, may be formed in a self-aligning manner to the gate electrode 113 after the formation of the gate electrode 113. Alternatively, the photoelectric conversion region 101 may be formed through the insulator film 30 after the process d.

In the above-described method of manufacturing the photoelectric conversion apparatus, the order of the processes may be appropriately changed, a part of the processes may be omitted, or a suitable process may be added.

Figure 4D:
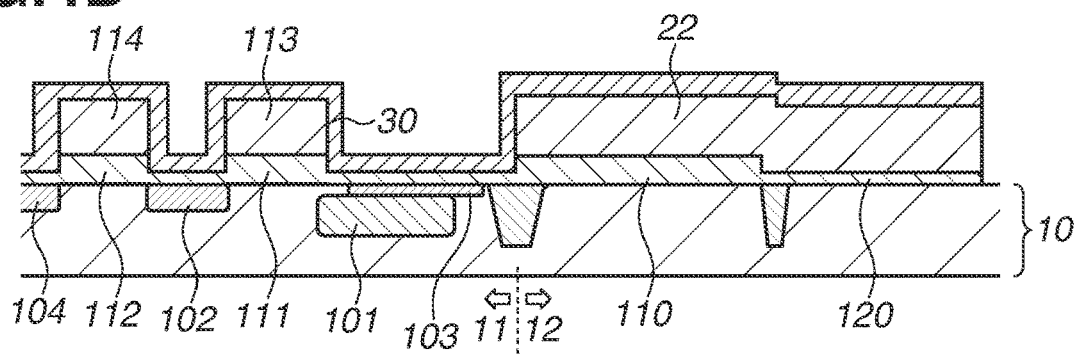

Another exemplary embodiment is described with reference to FIG. 4D. In the process c in FIG. 1C, the gate electrodes 123 and 124 are formed over the peripheral circuit area 12. In contrast, in the other exemplary embodiment, the gate electrodes 123 and 124 are not formed over the peripheral circuit area 12 in the process c in FIG. 1C. Alternatively, as illustrated in FIG. 4D, a part of the conductive film 21 is remained as a conductive film 22 over the peripheral circuit area 12. In the process d, the insulator film 30 is formed so as to cover the conductive film 22. The ion implantation into the pixel circuit area 11 through the insulator film 30 is performed in a manner similar to the processes e and f. Further, the insulator film 30 is removed in a manner similar to the process g. Thereafter, the conductive film 22 is patterned to form the gate electrodes 123 and 124 from the conductive film 22 as illustrated in FIG. 2C. The subsequent ion implantation into the peripheral circuit area 12 and the subsequent formation of the side walls 52 and 53 may be performed in a manner similar to the process h and the subsequent processes.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-167257, filed Aug. 31, 2017, which is hereby incorporated by reference herein in its entirety.

What is claimed is:

1. A method of manufacturing a photoelectric conversion apparatus, the manufacturing method comprising:
preparing a semiconductor substrate that includes a pixel circuit area and a peripheral circuit area;
forming an insulator film that covers the pixel circuit area and the peripheral circuit area while the pixel circuit area is provided with a gate electrode of a first transistor;
heating the semiconductor substrate while the pixel circuit area is covered with the insulator film;
performing ion implantation into the pixel circuit area through the insulator film;
performing ion implantation into the peripheral circuit area after the heating while the peripheral circuit area is provided with a gate electrode of a second transistor; and
forming a side wall on a side surface of the gate electrode of the second transistor after the ion implantation into the peripheral circuit area,
wherein, in the ion implantation into the peripheral circuit area, at least a part of a source/drain region of the second transistor is formed.

2. The manufacturing method according to claim 1, wherein the ion implantation into the pixel circuit area through the insulator film includes formation of a drain region of the first transistor.

3. The manufacturing method according to claim 1, wherein the ion implantation into the pixel circuit area through the insulator film includes ion implantation of boron into the pixel circuit area.

4. The manufacturing method according to claim 1, further comprising forming a photoelectric conversion region in the pixel circuit area before formation of the insulator film, wherein the photoelectric conversion region has a photodiode structure.

5. The manufacturing method according to claim 4, wherein the formation of the photoelectric conversion region is performed before formation of the gate electrode of the first transistor.

6. The manufacturing method according to claim 4, wherein the ion implantation into the pixel circuit area through the insulator film includes formation of an impurity region of a conductive type opposite to a conductive type of the photoelectric conversion region, between the photoelectric conversion region and the insulator film.

7. The manufacturing method according to claim 3, wherein the heating is performed before the ion implantation into the pixel circuit area through the insulator film.

8. The manufacturing method according to claim 7, further comprising, after the ion implantation into the pixel circuit area through the insulator film, further heating the semiconductor substrate while the semiconductor substrate is covered with the insulator film.

9. The manufacturing method according to claim 8, wherein the further heating performed after the ion implantation into the pixel circuit area through the insulator film is performed not to cause a temperature of the semiconductor substrate to exceed a temperature of the semiconductor substrate in the heating performed before the ion implantation into the pixel circuit area through the insulator film.

10. The manufacturing method according to claim 1, wherein the heating is performed after the ion implantation into the pixel circuit area.

11. The manufacturing method according to claim 10, wherein, in the heating, a temperature of the semiconductor substrate is made higher than a film formation temperature of the insulator film.

12. The manufacturing method according to claim 1, wherein, in the heating, a temperature of the semiconductor substrate is made equal to or higher than 850° C.

13. The manufacturing method according to claim 1, wherein a gate insulation film of the first transistor has a thickness larger than a thickness of a gate insulation film of the second transistor.

14. The manufacturing method according to claim 1, wherein the insulator film includes a silicon oxide layer, and no silicon nitride layer is formed on the semiconductor substrate between formation of the gate electrode of the first transistor and the heating of the semiconductor substrate.

15. The manufacturing method according to claim 14, wherein the insulator film is formed by a chemical vapor deposition (CVD) method.

16. The manufacturing method according to claim 1, wherein a thickness of the insulator film is 5 nm to 20 nm.

17. The manufacturing method according to claim 1, further comprising performing further ion implantation into the peripheral circuit area provided with the side wall,
wherein, in the further ion implantation into the peripheral circuit area, a part of the source/drain region of the second transistor is formed.

18. The manufacturing method according to claim 10,
wherein energy of the ion implantation into the peripheral circuit area is lower than energy of the ion implantation into the pixel circuit area through the insulator film, and
wherein the gate electrode of the second transistor is formed before forming the insulator film, and is covered with the insulator film.

19. A method of manufacturing a photoelectric conversion apparatus, the manufacturing method comprising:
preparing a semiconductor substrate that includes a pixel circuit area and a peripheral circuit area;

forming an insulator film that covers the pixel circuit area and the peripheral circuit area while the pixel circuit area is provided with a gate electrode of a first transistor;

heating the semiconductor substrate while the pixel circuit area is covered with the insulator film;

performing ion implantation into the pixel circuit area through the insulator film; removing at least a part of the insulator film before ion implantation into the peripheral circuit area, the part of the insulator film being over an impurity region formed by the ion implantation into the pixel circuit area through the insulator film;

performing the ion implantation into the peripheral circuit area after the heating while the peripheral circuit area is provided with a gate electrode of a second transistor; and forming a side wall on a side surface of the gate electrode of the second transistor after the ion implantation into the peripheral circuit area, wherein, in the ion implantation into the peripheral circuit area, at least a part of a source/drain region of the second transistor is formed.

20. The manufacturing method according to claim 19, wherein, in the removing the insulator film, another part of the insulator film, the another part of the insulator film being at least on/over the peripheral circuit area, is also removed before the ion implantation into the peripheral circuit area.

21. The manufacturing method according to claim 19, wherein, in the removing the insulator film, the insulator film is removed by wet etching.

22. The manufacturing method according to claim 20, further comprising forming a dielectric film that covers the side surface of the gate electrode of the second transistor, after the ion implantation into the pixel circuit area through the insulator film, wherein, in the forming the side wall, the side wall is formed from the dielectric film.

23. A method of manufacturing a photoelectric conversion apparatus, the manufacturing method comprising:

preparing a semiconductor substrate that includes a pixel circuit area and a peripheral circuit area;

forming an insulator film that covers the pixel circuit area and the peripheral circuit area while the pixel circuit area is provided with a gate electrode of a first transistor;

heating the semiconductor substrate while the pixel circuit area is covered with the insulator film;

performing ion implantation into the pixel circuit area through the insulator film;

performing ion implantation into the peripheral circuit area after the heating while the peripheral circuit area is provided with a gate electrode of a second transistor;

forming a dielectric film that covers a side surface of the gate electrode of the second transistor, after the ion implantation into the pixel circuit area through the insulator film; and forming a side wall on the side surface of the gate electrode of the second transistor after the ion implantation into the peripheral circuit area, wherein, in the ion implantation into the peripheral circuit area, at least a part of a source/drain region of the second transistor is formed, and wherein, in the forming the side wall, the side wall is formed from the dielectric film, and the dielectric film is remained over an impurity region formed by the ion implantation into the pixel circuit area through the insulator film.

24. The manufacturing method according to claim 23, further comprising forming a silicide part on the source/drain region by causing a metal film provided in contact with the dielectric film, to react with the semiconductor substrate, after the formation of the side wall.

* * * * *